United States Patent
Huang

[11] Patent Number: 6,001,721
[45] Date of Patent: Dec. 14, 1999

[54] SILICIDE AND SALICIDE ON THE SAME CHIP

[75] Inventor: Jenn Ming Huang, Hsin-Chu, Taiwan

[73] Assignee: Taiwan Semiconductor Manufacturing Company, Ltd., Hsin-Chu, Taiwan

[21] Appl. No.: 09/025,803

[22] Filed: Feb. 19, 1998

[51] Int. Cl.$^6$ .................................................. H01L 21/44
[52] U.S. Cl. .................. 438/597; 438/586; 438/598; 438/649; 438/655; 438/663; 438/682; 438/683
[58] Field of Search ................................. 438/597, 585, 438/586, 592, 598, 649, 655, 660, 663, 671, 682, 683, 299, 233, 229, 238, 256

[56] References Cited

U.S. PATENT DOCUMENTS

| | | | |
|---|---|---|---|
| 4,874,713 | 10/1989 | Gioia | 438/231 |
| 4,935,376 | 6/1990 | Hillenius et al. | 438/588 |
| 5,231,042 | 7/1993 | Ilderem et al. | 438/533 |
| 5,444,024 | 8/1995 | Anjum et al. | 437/200 |
| 5,508,212 | 4/1996 | Wang et al. | 437/24 |
| 5,635,426 | 6/1997 | Hayashi et al. | 438/453 |
| 5,648,287 | 7/1997 | Tsai et al. | 437/44 |
| 5,683,941 | 11/1997 | Kao et al. | 438/592 |
| 5,686,331 | 11/1997 | Song | 438/303 |
| 5,710,076 | 1/1998 | Dai et al. | 438/305 |
| 5,731,239 | 3/1998 | Wong et al. | 438/296 |
| 5,773,347 | 6/1998 | Kimura et al. | 438/302 |
| 5,824,577 | 10/1998 | Luich | 438/233 |
| 5,856,225 | 1/1999 | Lee et al. | 438/291 |
| 5,872,056 | 2/1999 | Manning | 438/637 |
| 5,904,533 | 5/1999 | Lin | 438/299 |
| 5,920,796 | 7/1999 | Wang et al. | 438/700 |
| 5,930,644 | 7/1999 | Tsai et al. | 438/424 |
| 5,953,612 | 9/1999 | Lin et al. | 438/299 |
| 5,953,633 | 9/1999 | Chen et al. | 438/683 |

*Primary Examiner*—John F. Niebling
*Assistant Examiner*—Lynne A. Gurley
*Attorney, Agent, or Firm*—George O. Saile; Stephen B. Ackerman

[57] ABSTRACT

A process is described wherein logic and memory share the same chip. Contacts to the gates in the memory areas are made using a silicide process, while contacts to the logic circuits are made using the SALICIDE process, thus ensuring high performance. The two processes have been integrated within a single chip by first covering the gate pedestals in both areas with a layer of cap oxide. The wafer is then covered with a layer of BARC (Bottom Anti-Reflection Coating) which is etched back so as to expose only the cap oxide that covers the top surfaces of the gate pedestals. This allows the cap oxide to be removed from only these top surfaces. In an alternative embodiment, photoresist may be used in place of BARC. The remaining cap oxide is then selectively removed in only the logic area and the standard SALICIDE process is applied, resulting in SALICIDE contacts to source, gate, and drain on the logic side and silicide contacts to the gates on the memory side.

20 Claims, 3 Drawing Sheets

SILICIDE AND SALICIDE ON THE SAME CHIP

FIELD OF THE INVENTION

The invention relates to the general field of integrated circuits with particular reference to the silicide and SALICIDE processes.

BACKGROUND OF THE INVENTION

As the dimensions within integrated circuits have grown ever smaller, solutions have had to be found to problems relating to misalignment of successive mask patterns relative to one another during processing. Thus, source and drain regions might not line up correctly relative to the gate, deposited contacts might not line up perfectly inside contact holes, and connections that were physically close together but had to be electrically isolated from one another might develop short circuits between them.

To overcome these problems, a variety of ingenious techniques have been introduced into the integrated circuit art. For example, alignment of source and drain relative to the gate was achieved by using the gate as a mask during ion implantation. The SALICIDE (self-aligned silicide) process took advantge of the fact that certain metals such as titanium or cobalt react when heated in contact with silicon to form conductive silicides but do not react with silicon oxide. Thus, oxide spacers on the vertical walls of the gate pedestal could be used to provide the necessary small, but well controlled, separation between the source and drain contacts and the gate contact.

Although the SALICIDE method made possible significant reductions in device size, as devices shrink even further shorting between the gate and the source/drain can be a problem in circuits of very high density. In such cases it is desirable to be able to limit the SALICIDE process to the lower density areas (where performance is the main concern) and use a simple silicide approach in the high density areas to reduce the risk of gate/drain shorting.

While there are many references in the prior art to both processes, none of these, to our knowledge, addresses the specific problem of integrating these different contacting methods for use on a single chip in both memory and logic circuits. The SALICIDE process is described by, for example, Tsai et al. (U.S. Pat. No. 5,648,287 July 1997) and Wang et al. (U.S. Pat. No. 5,508,212 April 1996) while Anjum et al. (U.S. Pat. No. 5,444,024 August 1995) show how the growth of a titanium silicide layer can be controlled through pre-bombardment with argon ions. Hayashi et al. (U.S. Pat. No. 5,635,426 June 1997) show how silicidation can be used to form local interconnections.

SUMMARY OF THE INVENTION

It has been an object of the present invention to provide, in a wafer having both logic and memory areas, a method for simultaneously forming SALICIDE and silicide contacts in the logic and memory areas respectively.

A further object of the present invention has been that said method be fully compatible with existing methods currently used to implement the SALICIDE and silicide processes separately.

These objects have been achieved by first covering the gate pedestals in both areas with a layer of cap oxide. The wafer is then covered with a layer of BARC (Bottom Anti-Reflection Coating) which is etched back so as to expose only the cap oxide that covers the top surfaces of the gate pedestals. This allows the cap oxide to be removed from only these top surfaces. In an alternative embodiment, photoresist may be used in place of BARC. The remaining cap oxide is then selectively removed in only the logic area and the standard SALICIDE process is applied, resulting in SALICIDE contacts to source, gate, and drain on the logic side and silicide contacts to the gates on the memory side.

DESCRIPTION OF THE PREFERRED EMBODIMENTS

The process that we describe below is suitable for an integrated circuit that has both logic and memory areas. In the logic areas contact to source/drain and gate is made using the SALICIDE method while in the memory area contact is made to the gate by a silicide method.

The process, as claimed, starts with a P type silicon wafer since the intent is to end up with N-channel devices, but it will be understood by those skilled in the art that P-channel devices could equally well have been made using this general approach.

Figure 1:
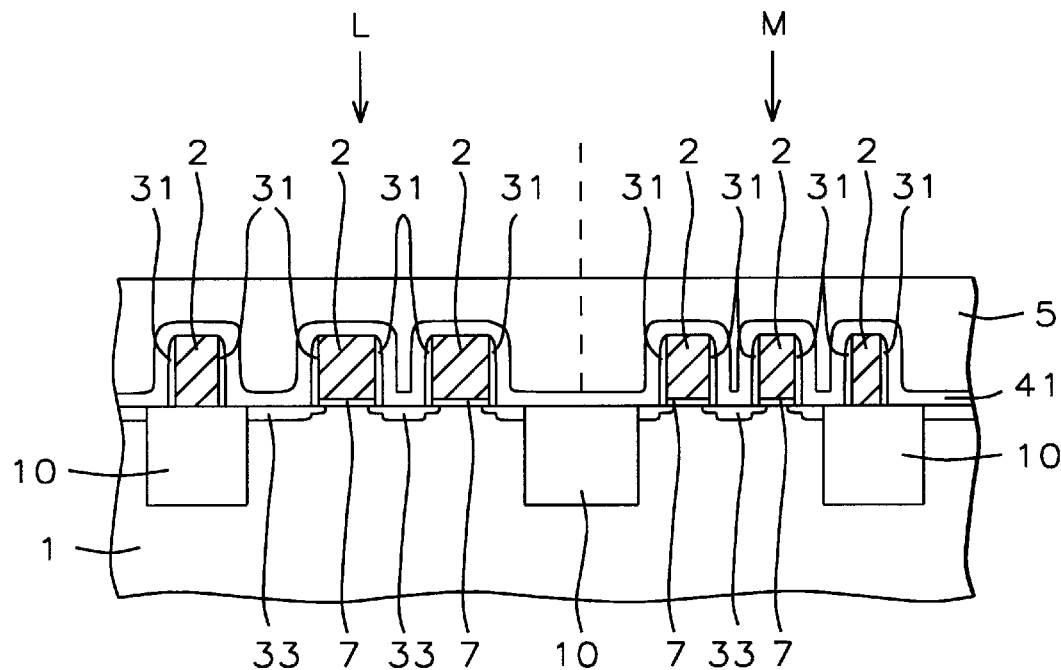
FIG. 1 shows a partially completed integrated circuit including a silicon wafer, divided into logic and memory areas, with gates, sources, and drains in place and covered by a layer of cap oxide.

The method taught by the present invention begins with the provision of the partially completed silicon integrated circuit illustrated in FIG. 1. The two areas pointed to by the arrows L and M represent logic and memory areas respectively. This partial integrated circuit includes P type silicon substrate 1 in whose surface shallow trenches 10, filled with insulation, have been formed for the purpose of electrically isolating various components from one another—known as STI (shallow trench isolation).

Polysilicon gate pedestals 2 extend above the surface of wafer 1 and are separated from it by layer 7 of gate oxide (except where one of the pedestals is over an isolation trench 10). On either side of pedestals 2 are source/drain regions 33 which were formed using a standard Low Density Drain (LDD) process. As part of the LDD process, spacers 31 were formed on the vertical sidewalls of pedestals 2. These spacers may be of silicon oxide or of silicon nitride, with silicon nitride being preferred.

Continuing reference to FIG. 1, the first step of the method of the present invention is the deposition of cap oxide layer 41 over the entire wafer. The thickness of the cap oxide is between about 100 and 500 Angstroms. Next, using spin coating, the wafer is covered with layer 5 of Bottom Anti Reflection Coating (BARC) to a thickness between about 800 and 2,000 Angstroms which is sufficient to fully cover cap oxide layer 41. Since the BARC is applied in liquid form it has a planar surface which is retained after it has been dried and baked to hardness.

Several materials may be used for the BARC layer which is formed by dissolving a primary polyimide (with or without a dye component) in a solvent such as cyclohexanone or PGMEA. Commercially available BARC photoresists include BARLi, XHRi-11, and SWK365D. In an alternative embodiment of the invention, photoresist was used in place of the BARC. The advantage of using photoresist is that it is cheaper than BARC. Where cost is not an over-riding consideration, BARC is preferred because it allows for better control of etch uniformity.

Figure 2:
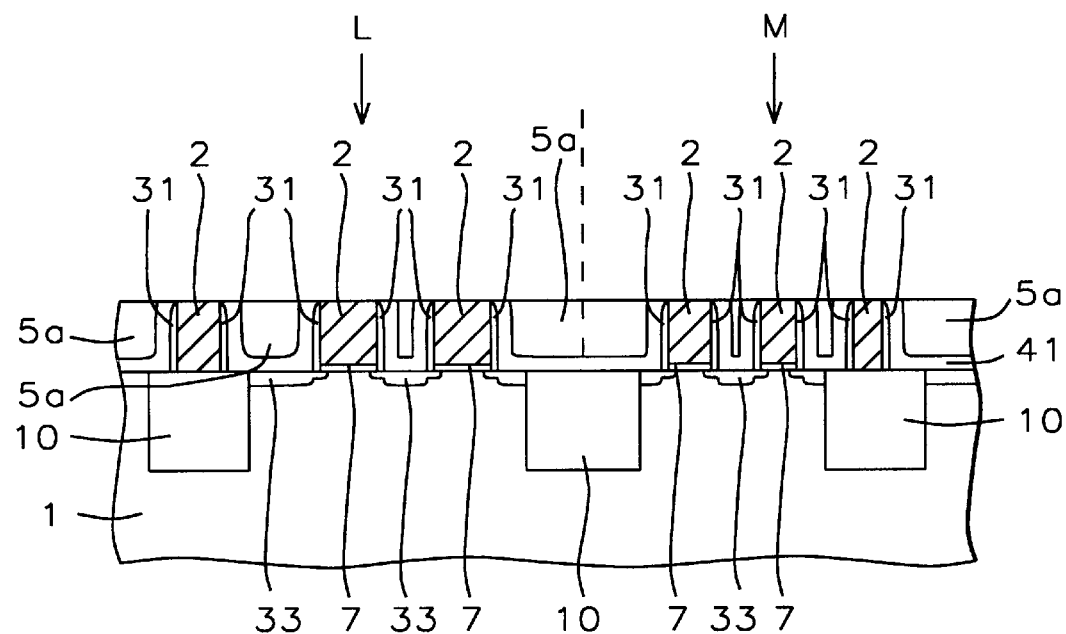
FIG. 2 illustrates the appearance of the structure after the removal of cap oxide from the top surfaces of the gates.

Referring now to FIG. 2, BARC layer 5 is etched back until the cap oxide on the top surfaces of the gate pedestals is fully exposed but cap oxide layer 41 continues to be coated with BARC (or photoresist) everywhere else including where it is on sidewall spacers 31. The method that we have used for etching back the layer of BARC has been to use a nitrogen/oxygen plasma at a power level of about 300 watts for about 25 minutes.

Once the BARC or photoresist has been etched back as described above, all of cap oxide layer 41 not covered by the BARC (or photoresist) is removed. This exposes (uncovers) the top surfaces of gate pedestals 2 giving the structure the appearance illustrated in FIG. 2. Note that all BARC that was below the level of the pedestal top surfaces still remains at this point and has been designated as 5a in FIG. 2.

Figure 3:
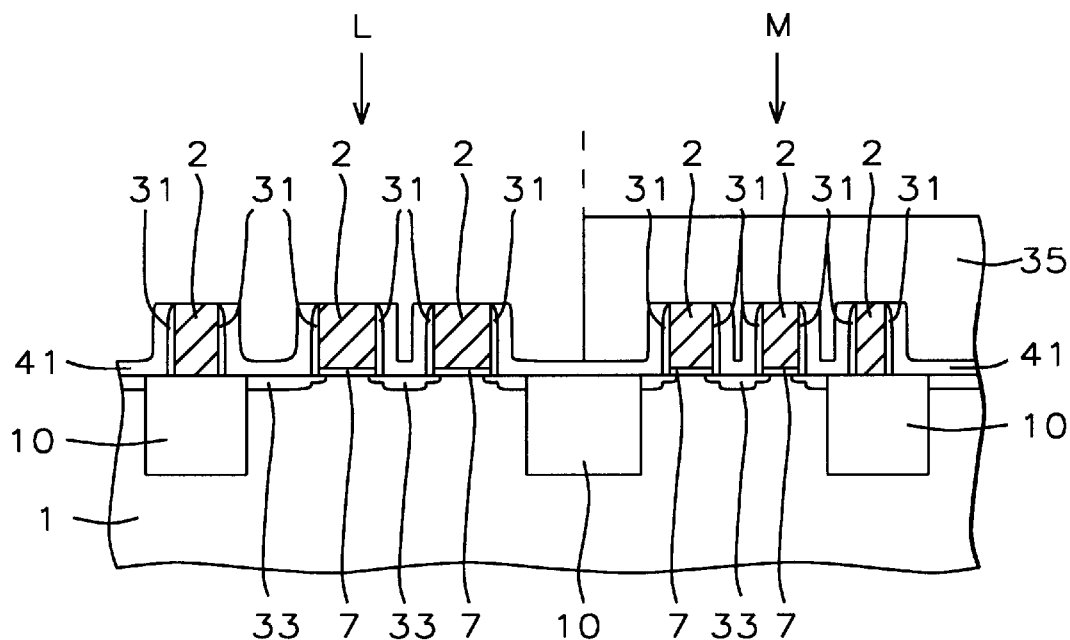
FIGS. 3 and 4 show how the cap oxide is selectively removed from only the logic area.
Figure 4:
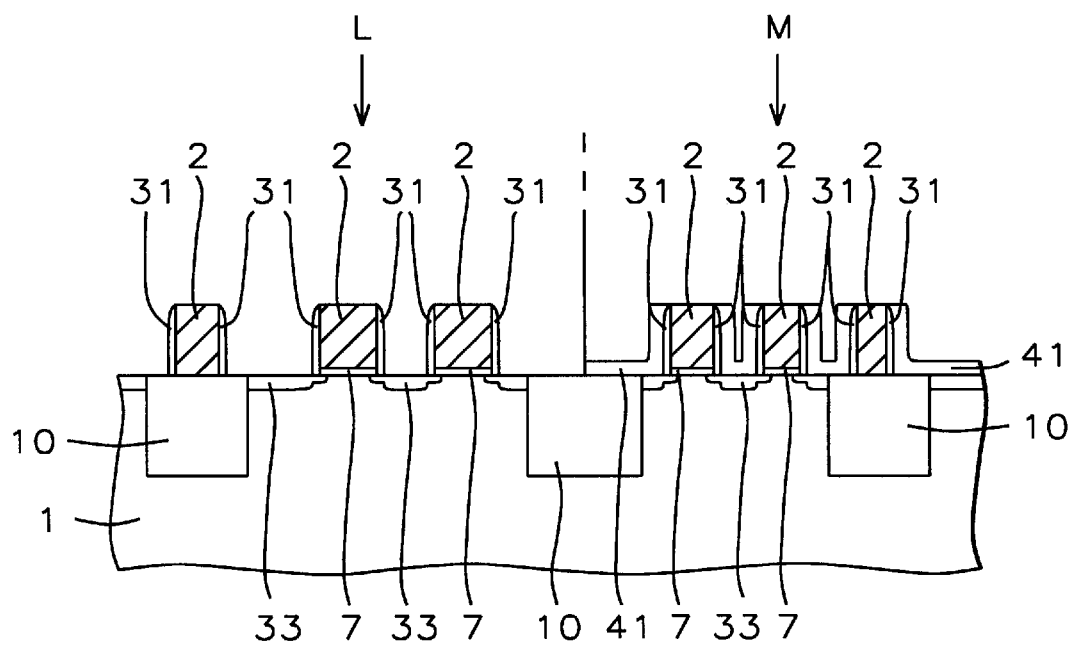

The next step is the removal of the layer of BARC. This is accomplished by using a wet etchant such as an organic oxidizing agent dissolved in hot sulphuric acid, in a similar manner to that used for removing photoresist. Then, as shown in FIG. 3, the wafer is coated with a layer of photoresist 35 which is patterned so as to cover only the memory. This allows selective removal of the cap oxide layer 41 from the logic area. Removal of the layer of cap oxide was accomplished by first etching in HF or a buffered oxide etch followed by a fluorine based dry etch step. This is similar to what was used for removing other oxide layers and is illustrated in FIG. 4 which also shows the photoresist as having been removed.

The standard SALICIDE process is now applied to the entire wafer. First a layer of a silicide forming metal, such as titanium or cobalt or titanium/titanium nitride, between about 150 and 450 Angstroms thick, is deposited on the wafer which is then subjected to a rapid thermal anneal (RTA) consisting of heating the wafer to between about 650 and 750° C. for between about 10 and 30 seconds. This causes the deposited metal to react with the silicon and form its silicide wherever it is in direct contact with the silicon. All unreacted metal is then selectively removed, resulting in the formation of self-aligned source, gate, and drain contacts 51 in the logic area and gate contacts 54 in the logic area.

Figure 5:
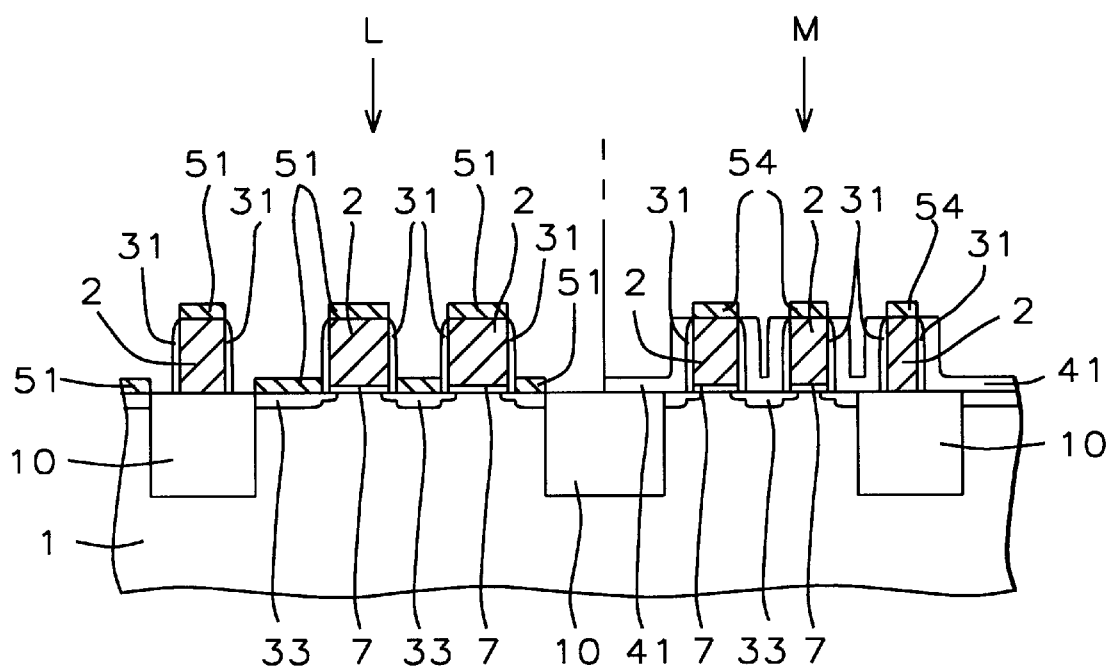
FIG. 5 illustrates the appearance of the structure at the conclusion of the process including SALICIDE contacts to source, gate and drain on the logic side and silicide contacts to the gate on the memory side.

The process of the present invention concludes by subjecting the wafer to a second rapid thermal anneal which consists of heating the wafer to a temperature between about 800 and 900° C. for between about 10 and 30 seconds. At this point the wafer has the appearance shown in FIG. 5.

While the invention has been particularly shown and described with reference to the preferred embodiments thereof, it will be understood by those skilled in the art that various changes in form and details may be made without departing from the spirit and scope of the invention.

What is claimed is:

1. A method of forming contacts to an integrated circuit comprising the sequential steps of:

providing a partially completed integrated circuit, having logic and memory areas and including a P type silicon wafer, shallow trench isolation regions, N-type source and drain regions, a layer of gate oxide, and polysilicon gate pedestals having a top surface and sidewall spacers;

depositing a layer of cap oxide over said wafer;

coating the wafer with a layer of BARC having a planar surface and a thickness sufficient to fully cover said layer of cap oxide;

etching back said layer of BARC until the cap oxide on the top surface of the gate pedestals is fully exposed while cap oxide on said sidewall spacers continues to be covered by the BARC;

removing all cap oxide not covered by the BARC, thereby exposing the top surfaces of the gate pedestals;

removing the layer of BARC;

coating the wafer with a layer of photoresist and then patterning the photoresist so that it covers only the memory area;

removing all cap oxide that is not covered by photoresist;

removing the photoresist;

depositing a layer of a silicide forming metal on the wafer;

subjecting the wafer to a first rapid thermal anneal whereby the metal reacts to form a layer of silicide wherever it is in direct contact with silicon;

removing all unreacted metal thereby forming self-aligned source, gate, and drain contacts in the logic area and gate contacts in the memory area; and subjecting the wafer to a second rapid thermal anneal.

2. The method of claim 1 wherein the layer of cap oxide is deposited to a thickness between about 100 and 300 Angstroms.

3. The method of claim 1 wherein the BARC layer is selected from the group consisting of a primary polyimide including a dye component, a primary polyimide without a dye component, BARLi, XHRi-11, and SWK365D.

4. The method of claim 1 wherein the BARC layer is laid down to a thickness between about 800 and 2,000 microns.

5. The method of claim 1 wherein the step of etching back the layer of BARC further comprises using a nitrogen/oxygen plasma at a power level of about 300 watts for about 25 minutes.

6. The method of claim 1 wherein the step of removing the layer of cap oxide further comprises etching in a buffered oxide etch followed by a fluorine based dry etch step.

7. The method of claim 1 wherein the step of removing the layer of BARC further comprises etching with an organic oxidizing agent dissolved in hot sulphuric acid.

8. The method of claim 1 wherein said layer of silicide forming metal is deposited to a thickness between about 150 and 450 Angstroms.

9. The method of claim 1 wherein said layer of silicide forming metal is titanium or cobalt or titanium/titanium nitride.

10. The method of claim 1 wherein said first rapid thermal anneal further comprises heating the wafer to a temperature between about 650 and 750° C. for between about 20 and 30 seconds.

11. The method of claim 1 wherein said second rapid thermal anneal further comprises heating the wafer to a temperature between about 800 and 900° C. for between about 10 and 30 seconds.

12. A method of forming contacts to an integrated circuit comprising the sequential steps of:

providing a partially completed integrated circuit, having logic and memory areas and including a P type silicon wafer, shallow trench isolation regions, N-type source and drain regions, a layer of gate oxide, and polysilicon gate pedestals having a top surfaces and sidewall spacers;

depositing a layer of cap oxide over said wafer;

coating the wafer with a first layer of photoresist having a planar surface and a thickness sufficient to fully cover said layer of cap oxide;

etching back said layer of photoresist until the cap oxide on the top surface of the gate pedestals is fully exposed while cap oxide on said sidewall spacers continues to be covered by the photoresist;

removing all cap oxide not covered by the photoresist, thereby exposing the top surfaces of the gate pedestals;

removing the first layer of photoresist;

coating the wafer with a second layer of photoresist and then patterning the second photoresist so that it covers only the memory area;

removing all cap oxide that is not covered by photoresist;

removing the second layer of photoresist;

depositing a layer of a silicide forming metal on the wafer;

subjecting the wafer to a first rapid thermal anneal whereby the metal reacts to form a layer of silicide wherever it is in direct contact with silicon;

removing all unreacted metal thereby forming self-aligned source, gate, and drain contacts in the logic area and gate contacts in the memory area; and subjecting the wafer to a second rapid thermal anneal.

13. The method of claim 12 wherein the layer of cap oxide is deposited to a thickness between about 100 and 500 Angstroms.

14. The method of claim 12 wherein the first photoresist layer is laid down to a thickness between about 800 and 2,000 Angstroms.

15. The method of claim 12 wherein the step of etching back the layer of photoresist further comprises using a nitrogen/oxygen plasma at a power level of about 300 watts for about 25 minutes.

16. The method of claim 12 wherein the step of removing the layer of cap oxide further comprises etching in a buffered oxide etch followed by a fluorine based dry etch step.

17. The method of claim 12 wherein said layer of silicide forming metal is deposited to a thickness between about 150 and 450 Angstroms.

18. The method of claim 12 wherein said layer of silicide forming metal is titanium or cobalt or titanium/titanium nitride.

19. The method of claim 12 wherein said first rapid thermal anneal further comprises heating the wafer to a temperature between about 650 and 750° C. for between about 10 and 30 seconds.

20. The method of claim 12 wherein said second rapid thermal anneal further comprises heating the wafer to a temperature between about 800 and 900° C. for between about 10 and 30 seconds.

* * * * *